United States Patent

Carobolante

[11] Patent Number: 5,450,520
[45] Date of Patent: Sep. 12, 1995

[54] LOAD CURRENT SAMPLING TECHNIQUE

[75] Inventor: Francesco Carobolante, Phoenix, Ariz.

[73] Assignee: SGS-Thomson Microelectronics, Inc., Carrollton, Tex.

[21] Appl. No.: 203,519

[22] Filed: Feb. 28, 1994

Related U.S. Application Data

[63] Continuation of Ser. No. 745,911, Aug. 16, 1991, abandoned.

[51] Int. Cl.[6] .............................................. H02P 5/168
[52] U.S. Cl. .................................. 388/815; 388/823; 327/108; 327/576
[58] Field of Search ...................... 388/809–815, 388/816–823, 800–808; 318/34, 49, 66–67, 98, 111–113, 798–812; 307/260, 270, 315, 313, 239–244, 248, 571–585

[56] References Cited

U.S. PATENT DOCUMENTS

| | | | |
|---|---|---|---|
| 4,120,305 | 10/1978 | Rhoads et al. | 128/405 |
| 4,125,800 | 11/1978 | Jones | 318/681 X |
| 4,232,257 | 11/1980 | Harshberger | 318/271 |
| 4,403,177 | 9/1983 | Weber et al. | 318/696 X |
| 4,471,283 | 9/1984 | Presley | 318/685 X |
| 4,590,395 | 5/1986 | O'Connor et al. | 307/570 |
| 4,651,069 | 3/1987 | Pellegrini | 318/721 X |
| 4,876,491 | 10/1989 | Squires et al. | 318/138 |
| 4,885,486 | 12/1989 | Shekhawat et al. | 307/570 |
| 4,885,517 | 12/1989 | Pennock | 318/678 |
| 5,030,899 | 7/1991 | Nishibe et al. | 318/444 |
| 5,032,774 | 7/1991 | Juzswik | 318/256 X |
| 5,045,734 | 11/1991 | Mehl | 307/570 |
| 5,166,544 | 11/1992 | Carobolante | 307/270 |

*Primary Examiner*—David S. Martin
*Attorney, Agent, or Firm*—Richard A. Bachand; Rodney M. Anderson; Lisa K. Jorgenson

[57] ABSTRACT

A circuit for sensing the current delivered to a load, or multiple loads, such presented by a polyphase DC motor, without significantly dissipating the energy delivered to the load, has a predriver circuit and a power delivery circuit for each load. The predriver circuit is connected in a series path between a voltage source and a control element of the power delivery circuit, and the power delivery circuit is connected between a connection node and a respective one of the loads. A sensing element is connected in a series path between the source of voltage and the power delivery circuit connection node. In a preferred embodiment, the sensing element is a resistor, the predriver circuit is a PNP transistor, and the power delivery circuit is an NPN transistor. The PNP and NPN transistors are connected to form a pseudo-Darlington transistor pair, with the collectors of the NPN transistors interconnected to enable a single sense resistor to be used to sense the current in each of the loads.

9 Claims, 1 Drawing Sheet

5,450,520

LOAD CURRENT SAMPLING TECHNIQUE

The present application is a continuation of application Ser. No. 07/745,911, filed Aug. 16, 1991, now abandoned.

BACKGROUND OF THE INVENTION

1. Field of the Invention

This invention relates to improvements in circuits for sensing load currents, and more particularly to improvements in load current sensing circuits which can be used to sense currents in multiple load applications, such as in polyphase DC motor systems or the like.

2. Description of the Prior Art

Information concerning current flowing in a load is often sought for various applications, for example, in current limiting, transconductance control, fault detection, and so forth. It is usually desirable that such information be developed without dissipating energy which would otherwise be delivered to the load. Thus, such information is often obtained by various non-interfering methods. For example, one way such information has been developed in the past is by sampling the magnetic field induced by the current flowing in selected conductors. This approach, however, is usually undesirably expensive for a reasonable precision. Another way has been used is to insert a resistance or other element in series with the load and sample the voltage developed across it. Although this approach is less expensive than the first, it requires the expenditure of some output energy in the sensing element.

Other approaches are also known, such as the use of a sense FET, or through current mirroring. One common approach is by inserting a resistor in series with the power supply (usually at the ground terminal) and sensing the voltage developed across it. This approach has been used in multiple load systems, such as multiple winding motor loads in which one or more windings are energized in series at any given time. An example of this approach is illustrated in FIG. 1. As shown, an FET switching circuit 10 switches voltage from $V_{cc}$ through selected windings of a motor 12 to ground. A current sensing resistor 13 is connected in series between the switching circuit 10 and ground. The voltage across the resistor 13 indicates the current flowing through the load, i.e., the selected windings of the motor 12. This approach, however, also has the disadvantage that it dissipates part of the available power to the motor.

One technique which has been employed in motor driver circuits uses a plurality of sense resistors, each in series with one or more of the driver transistors. One such circuit, for example, uses four transistors connected in two series paths, each series path including a sense resistor. The motor is connected between interconnecting nodes of each path, and the transistors are switched to provide current paths through the motor including alternatingly a first transistor from one path and a second transistor from the other. The voltage drops on each resistor are compared by a differential amplifier to generate an error signal to correct the bias on the driver transistors. However, such system requires separate resistors for each series path, and requires more complex comparing circuits if more than two current paths are employed.

SUMMARY OF THE INVENTION

In light of the above, therefore, it is an object of the invention to provide a circuit for sensing current to a load which minimizes dissipating affects upon the energy delivered to the load.

It is another object of the invention to provide a circuit of the type described which can be used for sensing current to multiple load systems such as multiple winding motors, polyphase DC motors, or the like.

It is another object of the invention to provide a circuit for sensing load current of the type described which can utilize a single sense device for multiple load systems, and which reduces the required complexity of the associated load current sensing circuitry.

In a broad aspect of the invention, a sensing element is placed in the driving circuit, so that it will not unduly dissipate energy which would otherwise be delivered to the load. More particularly, the invention is particularly well suited for use in circuits in which the drivers are connected in a pseudo-Darlington configuration. (The term "pseudo-Darlington" configuration is used herein to indicate a transistor connection in which the collector of one transistor is connected to the base of the other to form an equivalent high gain PNP transistor structure.) In such circuits, although a small voltage drop may appear across the sensing element, the voltage drop will not unduly degrade the performance of the driver since its total voltage drop when conducting is limited by the base-emitter voltage of the NPN transistor (which cannot saturate) and the saturation voltage of the PNP transistor.

Thus, in accordance with a preferred embodiment of the invention, a method is provided for sensing the current delivered to a load, or multiple loads, such as a polyphase DC motor, without significantly dissipating the energy delivered. The method is accomplished by a circuit which includes a predriver circuit and a power delivery circuit for each load, such as respective coils or coil combinations of such motor. The predriver circuit is connected in a series path between a voltage source and a control element of the power delivery circuit, and the power delivery circuit is connected between a connection node and a respective one of the loads. A sensing element is connected in a series path between the source of voltage and the power delivery circuit connection node. In a preferred embodiment, the sensing element is a resistor, the predriver circuit is a PNP transistor, and the power delivery circuit is an NPN transistor. The PNP and NPN transistors are connected to form a pseudo-Darlington transistor pair, with the collectors of the NPN transistors interconnected to enable a single sense resistor to be used to sense the current in each of the loads.

Also presented is a motor driver circuit, incorporating a load current sensing circuit according to an embodiment of the invention.

BRIEF DESCRIPTION OF THE DRAWINGS

The invention is illustrated in the accompanying drawings, in which.

In the various Figures of the drawings, like reference numerals are used to denote like or similar parts.

DETAILED DESCRIPTION OF THE PREFERRED EMBODIMENT

Figure 1:
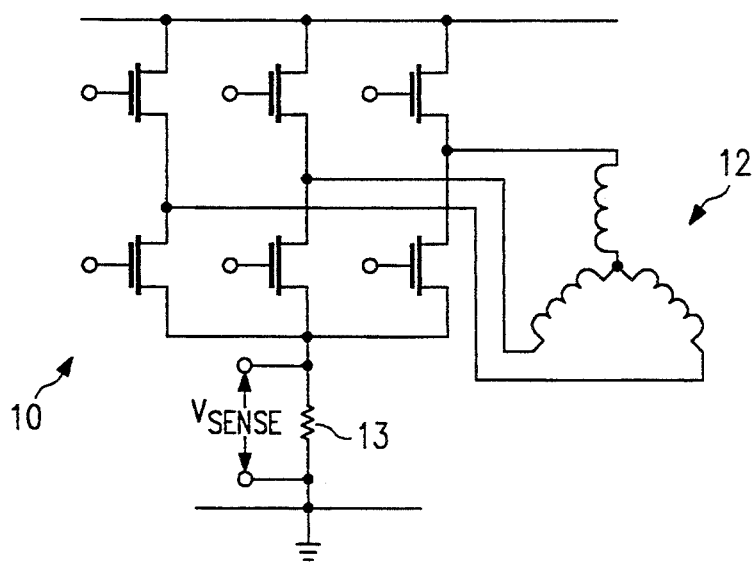
FIG. 1 is an electrical schematic diagram of a circuit of the prior art for driving a multiple motor load, illustrating a current sensing resistor in a ground line.
Figure 2:
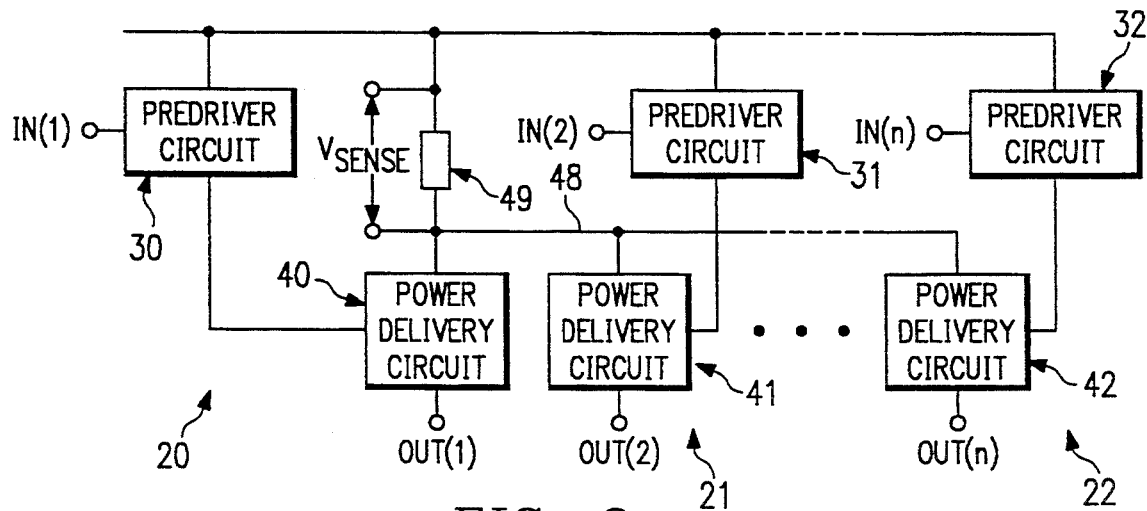
FIG. 2 is an electrical schematic box diagram illustrating a preferred embodiment of the present invention in which a sensing element is provided in an output driving circuit.
Figure 3:
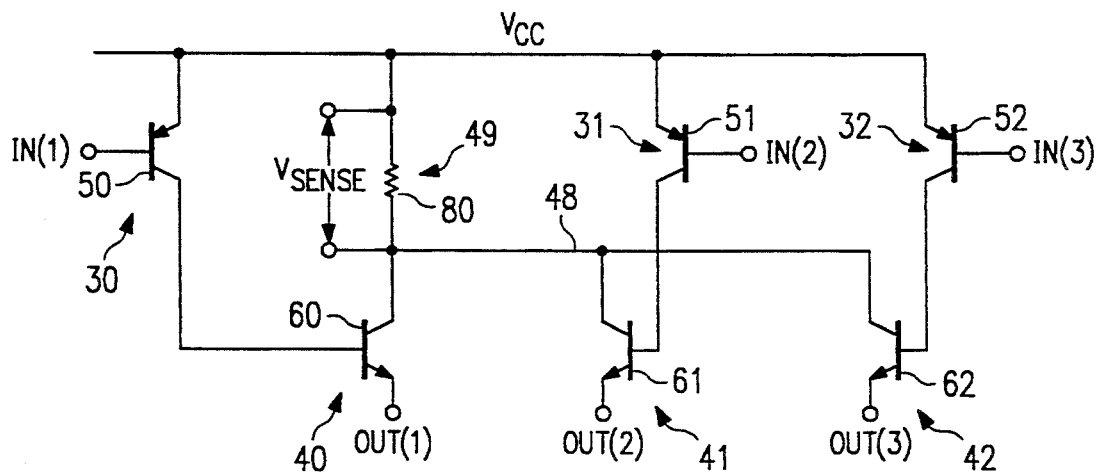
FIG. 3 is an electrical schematic diagram of a circuit showing one way for fabricating the sensing concept of FIG. 2.

A preferred embodiment of the invention is illustrated in FIGS. 2 and 3, to which reference is now made. In FIG. 2, a load current sensing technique is shown in conjunction with a plurality of load driving circuits. More particularly, a plurality of load driving circuits 20, 21, ... 22 are shown. Each section is identically constructed, and each includes a predriver circuit 30, 31, ... 32, and a power delivery circuit 40, 41, ... 42. Each predriver circuit receives a respective input IN(1), IN(2), ... IN(n), and is connected between a voltage supply and a control element (not shown) of a respective one of the power delivery circuits 40, 41, ... 42 to control the current flowing through the power delivery circuits 40, 41, ... 42.

Each of the power delivery circuits 40, 41, ... 42 is connected to a common node 48 on one side and to a load on the other, each providing a respective load current output OUT(1), OUT(2), ... OUT(n). The load current outputs OUT(1), OUT(2), ... OUT(n) can be connected to desired loads, for example, respective coil winding terminals of a polyphase DC motor (not shown), or other load.

A sensing element 49 is connected between the voltage supply and the common node 48. The sensing element 49 can be a device, such as a resistor, across which a voltage can be developed from which the current flowing through it can be determined. Thus, as current flows through any of the power delivery circuits 40, 41, ... 42, it can be sensed by the voltage on the sensing element 49.

One circuit by which the circuit of FIG. 2 can be implemented is shown in FIG. 3. The circuit can be used, for example, in providing driving power to a three phase DC motor, and includes, as shown, the predriver circuits 30, 31, and 32, each of which can be a PNP transistor 50, 51, and 52, and each of the power delivery circuits 40, 41, and 42, which each can be an NPN transistor 60, 61, and 62, connected as pseudo-Darlington transistor pairs. Thus, the emitter collector path of the PNP transistors 50, 51, and 52 is connected between a voltage source, $V_{cc}$, and the base of respective NPN transistors 60, 61, and 62. The input signals IN(1), IN(2), and IN(3) are connected to the respective bases of the PNP transistors 50, 51, and 52, as shown.

The collectors of each of the NPN transistors 60, 61, and 62 are connected to the common node 48, and the respective emitters deliver the output signals OUT(1), OUT(2), and OUT(3).

Finally a resistor 80 is connected between the common node 48 and $V_{cc}$ as shown, across which a voltage is developed as current flows through any of the power delivery transistors 60, 61, and 62. It will be appreciated that the resistor 80 can be made small, so to not significantly absorb power which otherwise would be delivered to the load(s) at OUT(1), OUT(2), and OUT(3). It should also be noted that by virtue of the circuit configuration, only a single resistor is required to enable the load current to be sensed.

Although the invention has been described and illustrated with a certain degree of particularity, it is understood that the present disclosure has been made by way of example only, and that numerous changes in the combination and arrangements of parts and features can be made by those skilled in the art without departing from the spirit and scope of the invention, as hereinafter claimed.

I claim:

1. A driver circuit for driving a load having a plurality of driving inputs, comprising:
    a plurality of predriver transistors, each having a base for receiving an input signal, having a collector coupled to a power supply, and having an emitter;
    a plurality of power delivery transistors, each associated with one of said plurality of predriver transistors and having a conductivity type opposite therefrom, each of said power delivery transistors having a collector-emitter path connected between a connection node, in common with each of said plurality of power delivery transistors, and a respective one of said plurality of driving inputs, and having a base connected to the emitter of its associated predriver transistor;
    a sensing element connected between the power supply and said power delivery circuit connection node.

2. The driver circuit of claim 1 wherein said sensing element comprises a resistor.

3. The driver circuit of claim 1 wherein said load comprises a polyphase DC motor having a plurality of coil inputs;
    and wherein a respective one of said plurality of driving inputs is connected to each of said plurality of coil inputs, for delivering output current thereto 4. The driver circuit of claim 3 wherein said sensing element comprises a resistor.

5. The driver circuit of claim 4 wherein each of said predriver transistors comprises a PNP transistor;
    and wherein each of said power delivery transistors comprises an NPN transistor.

6. A circuit for providing current to a plurality of loads, comprising:
    a plurality of complementary transistor pairs, each of said transistor pairs comprising:
        a first transistor having a control electrode, and having a conduction path coupled on one end to a power sense node and coupled at another end to a respective one of said loads; and
        a second transistor, of opposite conductivity type from that of said first transistor, having a conduction path connected in a series path between a power supply and the control electrode of said first transistor and having a control electrode for receiving an input signal;
    wherein the power sense node of said plurality of complementary transistor pairs are connected in common; and
    a sensing element connected in series between the power supply and said power sense node, to produce a sense voltage thereacross corresponding to the current provided by said plurality of complementary transistor pairs to the corresponding plurality of loads.

7. The circuit of claim 6 wherein said sensing element comprises a resistor.

8. The circuit of claim 6, wherein said first transistor in each of said plurality of complementary transistor pairs is a PNP transistor;

wherein said second transistor in each of said plurality of complementary transistor pairs is an NPN transistor;

and wherein, for each of said plurality of complementary transistor pairs, said PNP transistor maintains a bias on said NPN transistor to prevent said NPN transistor from saturating.

9. The circuit of claim 6 wherein said plurality of loads comprise a plurality of windings of a polyphase DC motor.

* * * * *